United States Patent [19]

Chemla et al.

[11] Patent Number: 4,860,296
[45] Date of Patent: Aug. 22, 1989

[54] LASER CONTROLLED BY A MULTIPLE-LAYER HETEROSTRUCTURE

[75] Inventors: Daniel S. Chemla, Rumson; David A. B. Miller, Lincroft; Peter W. Smith, Colts Neck, all of N.J.

[73] Assignee: American Telephone and Telegraph Company, AT&T Bell Laboratories, Murray Hill, N.J.

[21] Appl. No.: 53,498

[22] Filed: May 14, 1987

Related U.S. Application Data

[63] Continuation of Ser. No. 567,222, Dec. 30, 1983, abandoned.

[51] Int. Cl.$^4$ ............................................. H01S 3/19
[52] U.S. Cl. ...................................... 372/44; 372/11; 372/18; 372/46
[58] Field of Search .................... 372/11, 18, 44, 46

[56] References Cited

U.S. PATENT DOCUMENTS

| | | | |
|---|---|---|---|
| 3,492,599 | 1/1970 | Rigrod | 331/94.5 |
| 3,696,310 | 10/1972 | Paoli et al. | 331/94.5 |
| 3,983,509 | 9/1976 | Scifres et al. | 372/44 |
| 4,318,752 | 3/1982 | Tien | 372/44 |
| 4,350,960 | 9/1982 | Matthews et al. | 372/46 |
| 4,408,330 | 10/1983 | An | 372/46 |
| 4,425,650 | 1/1984 | Mito et al. | 372/46 |
| 4,432,092 | 2/1984 | Teramoto et al. | 372/46 |

OTHER PUBLICATIONS

C. Harder et al., "Passive Mode Locking of Buried Heterostructure Lasers With Nonuniform Current Injection", *Applied Physics Letters*, vol. 42, No. 9, May 1, 1983, pp. 772-774.
Van der Ziel et al., "Subpicosecond Pulses From Passively Mode Locked Ga-As Buried Optical Guide Semiconductor Lasers", *Applied Physics Letters*, vol. 39, No. 7, Oct. 1981, pp. 525-527.
E. P. Ippen et al., "Picosecond Pulse Generation with Diode Lasers", Picosecond Phenomena II, 1980, pp. 21-25, Springer-Verlag Berlin Heidelberg, N.Y.
H. A. Haus, "Mode-Locked Semiconductor Diode Lasers", *Phil. Trans. R. Soc. Lond.* A 298, 1980, pp. 257-266.

*Primary Examiner*—William L. Sikes
*Assistant Examiner*—Robert E. Wise
*Attorney, Agent, or Firm*—Walter G. Nilsen; Bruce S. Schneider

[57] ABSTRACT

The invention is a controlled laser having an optical resonator, a laser gain medium placed inside the optical resonator, the laser gain medium being capable of emitting light and of lasing with the light, a multiple layer heterostructure placed inside the optical resonator, and means for varying an optical absorption of the multiple layer heterostructure for the light in order to control an optical gain of the optical resonator, and thereby control lasing of the laser gain medium. Passive mode locking is achieved by the light emitted by the gain medium controlling the optical absorption of the multiple layer heterostructure. Active mode locking and modulation are achieved by controlling the optical absorption of the multiple layer heterostructure by applying an electric field to the multiple layer heterostructure. Control of laser gain by an external light source is achieved by controlling the optical absorption of the multiple layer heterostructure by illuminating it with light from the external light source. An embodiment of the multiple layer heterostructure fabricated as a GaAs-AlGaAs multiple quantum well with a Type I superlattice band structure is a passive mode locker for a semiconductor diode laser.

19 Claims, 5 Drawing Sheets

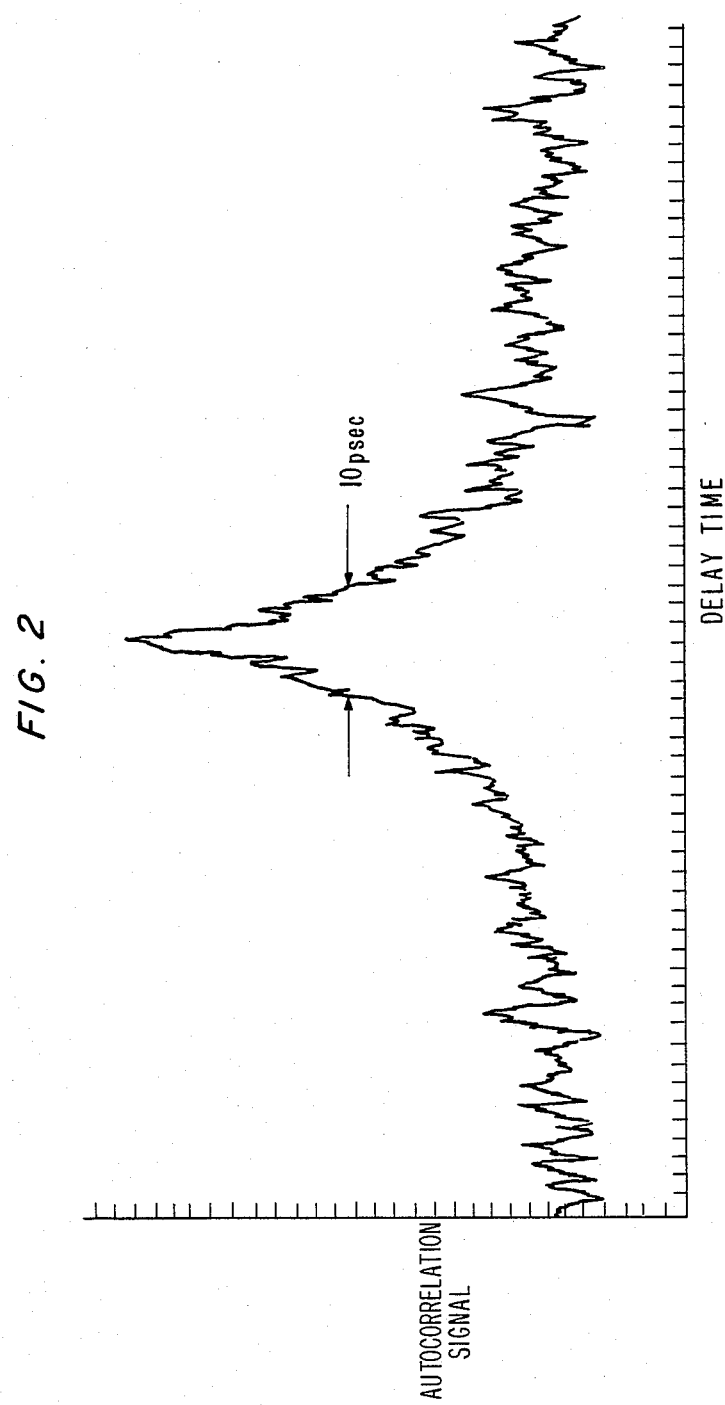

TYPE I SUPERLATTICE

TYPE II SUPERLATTICE

LASER CONTROLLED BY A MULTIPLE-LAYER HETEROSTRUCTURE

FIELD OF THE INVENTION

This invention relates to lasers and, more particularly, to control of the gain of lasers by use of a multiple layer heterostructure.

BACKGROUND OF THE INVENTION

Passive mode locking of lasers has been achieved by placing a saturable absorber within the lasing cavity. Passive mode locking of a semiconductor laser was described by van der Ziel et al. in an article entitled "Subpicosecond Pulses from Passively Mode-Locked GaAs Buried Optical Guide Semiconductor Lasers", in the journal *Applied Physics Letters*, Vol. 39, No. 7, pp. 525-527, October 1981. Van der Ziel et al. used proton bombardment near one end of the active region of a buried optical guide semiconductor laser in order to make absorption centers which served as a saturable absorber. A difficulty with this approach is that absorption center density and placement are hard to control and not accurately reproducible when proton bombardment is used to make the absorption centers.

Passive mode locking of semiconductor lasers has proven difficult because of the high intensities needed to saturate the usual nonlinear absorbers used to mode lock lasers. The materials used as absorbers to mode lock dye lasers or gas lasers require intensities which are generally out of the range of semiconductor lasers.

Another approach to control of semiconductor laser gain is to divide the semiconductor into two regions and to separately control the currents in each region. One region is biased to lase, and the other region is biased below threshold so that it behaves as an absorber wherein the absorption is controlled by control of the current. Active mode locking of a semiconductor laser is achieved by driving the control current at a frequency equal to the frequency difference between modes. However, only active mode locking and not passive mode locking is achieved by this method.

Also, control of the gain of a semiconductor laser may be achieved by simply controlling the pumping current. By increasing the current above threshold, the laser is turned on, and by decreasing the current below threshold, the laser is turned off. A difficulty with controlling the pumping current is that abruptly turning the laser on and off introduces unwanted spectral components in the spectrum of the output light. Highspeed modulation of the intensity of the output light is not satisfactorily achieved by this method, especially when a narrow frequency band is desirable in the spectrum of the output light.

No satisfactory method for directly controlling the gain of a laser by an external light source has been advanced. Such control is important in integrated optical circuits in which all optical logic is performed.

SUMMARY OF THE INVENTION

The invention solves the problems of laser cavity gain control such as passive and active mode locking of semiconductor lasers, and of laser cavity gain modulation, by placing a multiple layer heterostructure within the laser cavity. The invention is a controlled laser having an optical resonator, a laser gain medium placed inside the optical resonator, the laser gain medium being capable of emitting light and of lasing with the light, a multiple layer heterostructure placed inside the optical resonator, and means for varying an optical absorption of the multiple layer heterostructure for the light in order to control an optical gain of the optical resonator, and thereby control lasing of the laser gain medium.

Passive mode locking is achieved by the light emitted by the gain medium controlling the optical absorption of the multiple layer heterostructure. Active mode locking and modulation are achieved by controlling the optical absorption of the multiple layer heterostructure by applying an electric field to the multiple layer heterostructure. Control of laser gain by an external light source is achieved by controlling the optical absorption of the multiple layer heterostructure by illuminating it with light from the external light source.

BRIEF DESCRIPTION OF THE DRAWINGS

FIG. 2 is a graph showing an autocorrelation signal of an optical pulse from a mode locked semiconductor laser;

DETAILED DESCRIPTION

The gain of a laser may be controlled by a multiple layer heterostructure. Control of the laser gain is achieved by variations in the optical absorption coefficient of the multiple layer heterostructure. Details of a multiple layer heterostructure are discussed below in the section entitled "Multiple Layer Heterostructure".

Figure 1:
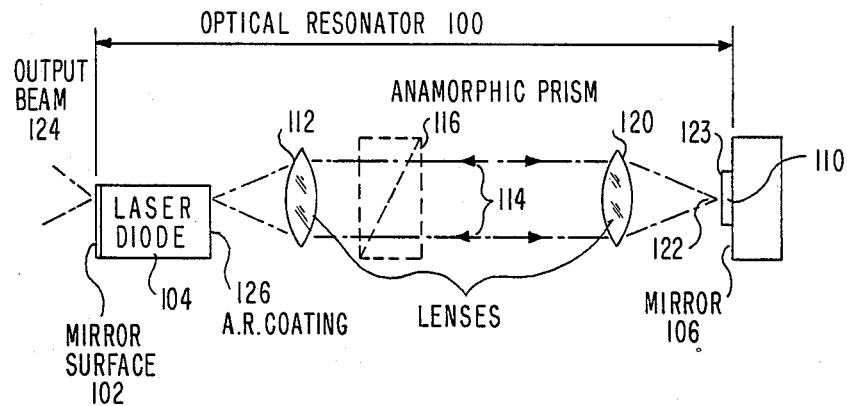
FIG. 1 is a schematic of an optical resonator containing a diode laser and saturable absorber.

FIG. 1 shows an exemplary embodiment of the invention wherein a semiconductor diode laser is mode locked. A typical laser has an optical resonator formed by two coaxial mirrors and some laser gain medium within this resonator. The frequency band over which laser oscillation can occur is determined by the frequency region over which the gain of the laser medium exceeds the resonator losses. Often, there are many modes of the optical resonator which fall within this oscillation band, and the laser output consists of radiation at a number of closely spaced frequencies. The total output of such a laser as a function of time will depend on the amplitudes, frequencies, and relative phases of all of these oscillating modes. If there is nothing which fixes these parameters, random fluctuations and nonlinear effects in the laser medium will cause them to change with time, and the output will vary in an uncontrolled way. If the oscillating modes are forced to maintain equal frequency spacings with a fixed phase relationship to each other, the output as a function of time will vary in a well-defined manner. The laser is then said to be "mode locked" or "phase locked". The form of this output will depend on which laser modes are oscillating and what phase relationship is maintained. It is possible to obtain: an FM-modulated output, a continuous pulse train, a spatially scanning laser beam, or a "machine gun" output where pulses of light appear periodically at different spatial positions on the laser output mirror.

Passive mode locking is achieved by placing a saturable absorber within the optical resonator. Pulses reflect from the mirrors and pass through the saturable absorber. The time duration of the individual pulses develops to a very short time interval which is determined by constants of both the gain medium and the saturable absorber. A multiple layer heterostructure makes an ideal saturable absorber for a semiconductor laser diode.

Passive mode locking of lasers is discussed in greater detail by P. W. Smith in an article entitled "Mode Locking of Lasers", *Proceedings of the IEEE*, Vol. 58, No. 9, pp. 1342-1357, September 1970, and also passive mode locking of semiconductor lasers is discussed by E. P. Ippen et al. in a chapter entitled "Picosecond Pulse Generation with Diode Lasers" and published in the book "Picosecond Phenomena II", edited by Hochstrasser, Kaiser, and Shank, Vol. 14 in Springer Series in Chemical Physics, Springer-Verlag, Berlin, Heidelberg, New York 1980.

Referring to FIG. 1, the optical resonator 100 is formed by partially reflecting mirror surface 102 of laser diode 104 and mirror surface 106. Multiple layer heterostructure 110 is attached to mirror surface 106 and serves as the saturable absorber. Lens 112 focuses the laser diode output into a parallel light beam 114. Anamorphic prism 116 gives the light beam 114 an approximately circular cross section. Lens 120 focuses the light beam 114 into a small spot 122 on the multiple layer heterostructure 110. The surface of the multiple layer heterostructure is coated with an anti-reflection coating 123. Output beam 124 exits from the optical resonator through mirror surface 102. An antireflection coating is placed on laser diode surface 126. Output beam 124 is a stream of mode locked pulses.

An exemplary embodiment of the invention which satisfactorily produced mode locked pulses was made using the arrangement shown in FIG. 1 and the following specification. The laser was a commercial Hitachi GaAs laser diode with one facet antireflection coated. The multiple layer heterostructure saturable absorber consisted of 47 layers of 98 Angstrom GaAs semiconductor layers and 100 Angstrom $Ga_{0.71}Al_{0.29}As$ material layers. The planes of the multiple layer heterostructure were oriented substantially perpendicular to the propagation direction of the light. The absorber was epoxied to a sapphire mirror with a 98% reflection coating. The unsaturated reflectivity of the mirror-absorber combination was 25% at the exciton peak. With the beam focused to an approximately 1 micron spot size on the absorber, stable mode locking was obtained. FIG. 2 gives the autocorrelation function of the output mode locked pulses. The width of the pulses was 10 picoseconds. The pulse spacing was 1 nanosecond showing that there were two equally spaced pulses circulating in the optical resonator.

The conditions necessary for mode locking a homogeneously broadened laser with a saturable absorber having a relaxation time longer than the pulse width were analyzed by H. A. Haus in an article entitled "Theory of Mode Locking with a Slow Saturable Absorber", in the journal *IEEE Journal of Quantum Electronics*, Vol. QE-11, No. 9, pp. 736-746, September 1975. Haus found that the relaxation time of the absorber must be faster than that of the gain and that one must have $$\frac{\tau_A}{A_A} > \frac{\tau_G}{A_G}$$

where $\tau_A$ and $\tau_G$ are the cross sections of the absorber and gain media, respectively, and $A_A$ and $A_G$ are the cross-sectional areas of the laser beam in the absorber and gain media, respectively. A multiple quantum well embodiment of a multiple layer heterostructure made of GaAs and GaAlAs exhibits a room temperature excitonic absorption spectrum. The optical saturation of the exciton absorption is caused by the screening effect of the optically created carriers, and this saturation takes place at optical intensities about a factor of 10 lower than those required to saturate the band-to-band transition. Thus, for a GaAs-GaAlAs multiple quantum well absorber, the result is:

$$\tau_A < < \tau_G.$$

The recombination time of photoexcited carriers in the multiple quantum well sample is much longer (~30 ns) than the gain recovery time of the laser medium (~2 ns). In order to reduce the absorption recovery time below 2 ns, the light beam must be tightly focused on the absorber. The diffusion of carriers out of this excited region then determines the recovery time. The recovery time is ~½ ns for a 2 μm spot size. This analysis is consistent with the results shown in FIG. 2. This analysis therefore suggests the parameters which must be taken into account in other embodiments of the invention.

Figure 3:
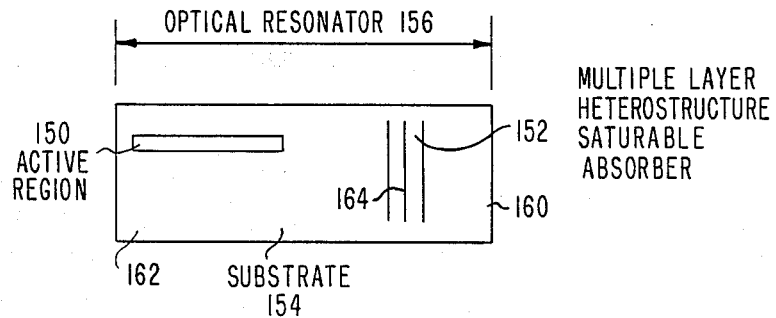
FIG. 3 is a cross section of a diode laser and a multiple layer heterostructure made in one unit.

FIG. 3 is a cross-sectional drawing of an exemplary embodiment of the invention. A diode laser active region 150 and a multiple layer heterostructure 152 are made on the same substrate 154. Active region 150 is a properly pumped laser gain medium. The optical resonator 156 is formed from the reflective end facets 160, 162 of substrate 154. Therefore, both the diode laser active region 150 and the multiple layer heterostructure are within optical resonator 156. The optical absorption of the multiple layer heterostructure 152 controls the overall gain of optical resonator 156. Passive mode locking of pulses produced by lasing of active region 150 is achieved by the optical absorption of multiple layer heterostructure 152. Also, the gain of optical resonator 156 may be controlled by controlling the optical absorption of multiple layer heterostructure 152 by means such as applying an electric field to multiple layer heterostructure 152, or by illuminating multiple layer heterostructure 152 using a light source external to optical resonator 156, or by other means. FIG. 3 shows the planes 164 of multiple layer heterostructure 152 as being oriented perpendicular to the direction of propagation of light emitted by active region 150. However, the planes 164 could be equally well-oriented at any angle with respect to the direction of light propagation.

Figure 4:
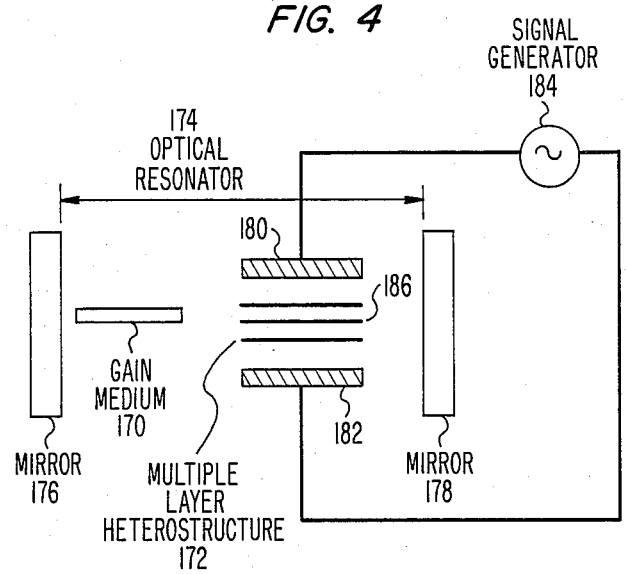
FIG. 4 is a schematic of an optical resonator containing both a gain medium and a multiple layer heterostructure with an electric potential applied to the multiple layer heterostructure.

FIG. 4 is a schematic showing an exemplary embodiment of the invention. A laser gain medium 170 and a multiple layer heterostructure 172 are located inside optical resonator 174. Optical resonator 174 is formed by mirrors 176, 178. Electrodes 180, 182 are electrically attached to multiple layer heterostructure 172. Signal generator 184 is connected to electrodes 180, 182 so that the output voltage of signal generator 184 applies an electric field to multiple layer heterostructure 172. The optical absorption of multiple layer heterostructure 172 varies as a result of the electric field applied by signal generator 184. Active mode locking of pulses emitted by gain medium 170 may be achieved by operating signal generator 184 at a frequency equal to the mode separation frequency. Also, modulation of the lasing output of gain medium 170 may be achieved by causing the optical absorption of multiple layer heterostructure 172 to vary by application of an electric field to multiple layer heterostructure 172. The layer planes 186 of multiple layer heterostructure 172 are shown in FIG. 4 as parallel to the direction of travel of light within optical resonator 174; however, the layer planes 186 could equally well be oriented at any angle with respect to the direction of travel of light within optical resonator 174. Also, the electric field could equally well be applied parallel to the layer planes 186.

Also, steady or slowly varying electric fields may advantageously be applied to the multiple layer heterostructure. Benefits of applying a steady or slowly varying electric field to the multiple layer heterostructure include: reduction of the absorber recovery time by sweeping carriers out of the multiple layer heterostructure; and adjustment of the absorption of the multiple layer heterostructure by both shifting energy levels of the charge carriers, and other interactions.

Figure 5:
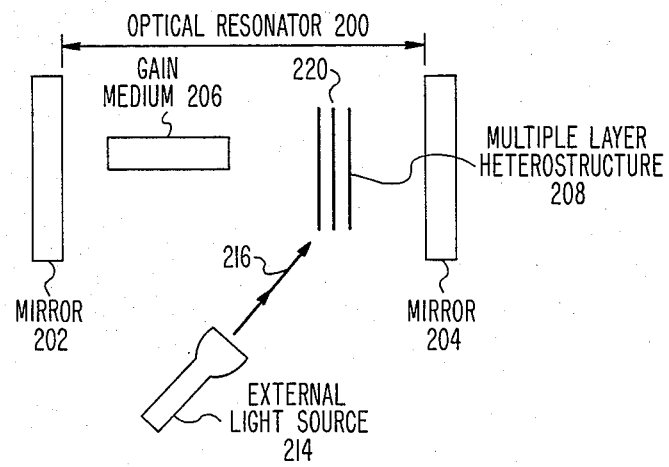
FIG. 5 is a schematic of an optical resonator containing both a gain medium and a multiple layer heterostructure with an external light source illuminating the multiple layer heterostructure.

FIG. 5 is a schematic showing an exemplary embodiment of the invention. Optical resonator 200 is formed by mirrors 202, 204 and contains both gain medium 206 and multiple layer heterostructure 208. Light source 214 is external to optical resonator 200 and emits light beam 216. Light source 214 illuminates multiple layer heterostructure 208 with light beam 216. Light beam 216 is absorbed within multiple layer heterostructure 208 and thereby causes the optical absorption, for lasing light emitted by gain medium 206 of multiple layer heterostructure 208, to vary. The variations in optical absorption of multiple layer heterostructure 208 causes the overall gain of optical resonator 200 to correspondingly vary. Therefore, external light source 214 may be used to turn lasing of gain medium 206 on and off, or may be used to actively mode lock the light emitted by gain medium 206, or may be used to turn passive mode locking induced by multiple layer heterostructure 208 on and off, or may be used to time lock one mode locked laser to another mode locked laser, or may be used for other purposes. The layer planes 220 of multiple layer heterostructure 208 are shown in FIG. 5 as perpendicular to the direction of light travel within optical resonator 200; however, the layer planes could equally well be oriented at some other convenient angle such as parallel to the direction of light travel, or at Brewster's angle.

Figure 6:
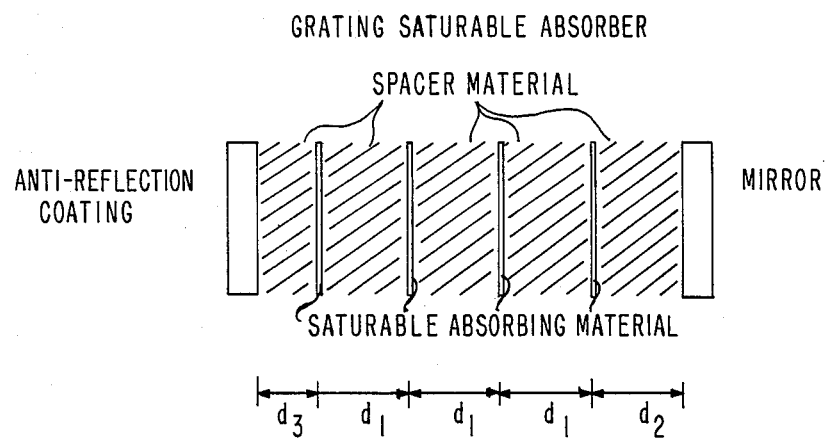
FIG. 6 is a cross-sectional showing a grating saturable absorber.

FIG. 6 shows a grating saturable absorber mounted on a mirror. The mirror forms one end of an optical resonator. A standing wave is formed in the grating saturable absorber due to the reflected and incident waves interacting inside the absorber. The grating saturable absorber is made by first choosing the saturable absorbing layers to have a thickness less than approximately one quarter of a wavelength inside the grating saturable absorber material. Second, the spacing and placement of the saturable absorbing layers are chosen so that they are located at the peaks of the standing wave intensity pattern. Thus, the high intensity antinodes are the only parts of the standing wave pattern involved in absorption. The efficiency of the saturable absorber is improved by concentrating all absorption into the regions of highest intensity of the standing wave pattern.

Referring to FIG. 6, the distance $d_1$ is chosen as one-half the wavelength inside the material of the spacing layers, or an integer multiple of one-half the wavelength. The distance $d_2$ is chosen to allow for the change of phase which occurs upon reflection so that the peaks of the standing wave occur at the saturable absorbing layers. Distance $d_3$ is also chosen so that standing wave peaks occur at the locations of saturable absorbing layers. Only a few layers are shown in FIG. 6 for convenience. Other embodiments could use more or fewer saturable absorbing layers than shown in FIG. 6. Quantum wells, made for example from GaAs/Al-GaAs, are particularly well-suited for making a grating saturable absorber. The quantum wells can be made with thickness less than approximately 100 to 200 Angstroms, and this thickness is much less than the separation $d_1$ between layers. For the light frequencies compatible with GaAs emission and absorption, the wavelength inside the GaAs is approximately 2000 Angstroms, so that spacing $d_1$, which is one-half wavelength, is approximately 1000 Angstroms. Additionally, narrow quantum wells with a thickness of 50 Angstroms could be included in the GaAlAs spacer layers to absorb impurities from the spacer layers. The thickness of 50 Angstroms will shift the absorption spectra of the 50 Angstrom layers away from the spectral region of interest for the thicker 100 Angstrom-to-200 Angstrom-thick saturable absorber layers, and so the 50 Angstrom layers will be optically substantially inactive and will not interfere substantially with the operation of the grating saturable absorber.

The intensity at the peak of the standing wave is twice the average intensity. Therefore, the use of a grating saturable absorber leads to an effective reduction in saturation intensity by a factor of 2. Also, the confinement of the carriers within the quantum wells assists the saturation of the absorption compared to other semiconductor materials as it prevents any diffusion of carriers out of the absorber layers. Prevention of diffusion of carriers away from the region of absorption enhances saturation of the absorption through the mechanism of trapped carriers reducing the absorption coefficient.

A grating saturable absorber mounted within a laser cavity is a convenient passive mode locker. Because the standing wave peaks occur at the locations of the saturable absorber layers, the average intensity needed to saturate the layers is reduced by a factor of 2.

Figure 7:
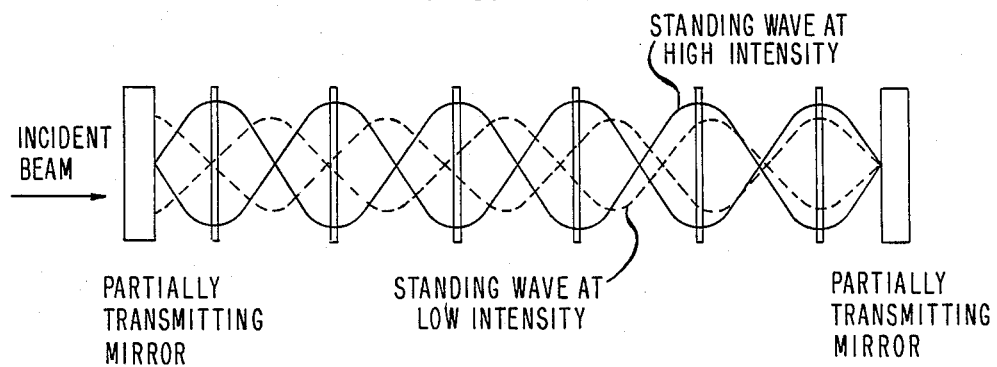
FIG. 7 is a cross-sectional showing a standing wave pattern in a grating saturable absorber.

FIG. 7 shows a Fabry-Perot cavity containing a grating saturable absorber. The operation of a nonlinear Fabry-Perot cavity device is enhanced by use of a grating saturable absorber. The quantum wells are spaced to coincide with the maxima in the interference pattern.

At low intensities the Fabry-Perot resonator is chosen to be off resonance. The standing wave pattern that forms, if any forms in this off-resonant condition, will be weak and the peaks will not always coincide with the GaAs regions. However, on increasing the intensity in the incident beam, the refractive index of the saturable absorber layers will change, moving the cavity towards resonance, and therefore moving the standing wave pattern toward the condition wherein the maxima in the standing wave pattern will coincide with the saturable absorption regions. The effective internal field will see a greater change in optical properties than if the location of the peaks of the standing wave pattern did not move, because the peaks will move into the regions of saturable absorption. The configuration of spaced saturable absorber regions has the advantages of reducing the switching power, increasing the width of the bistable region in the Fabry-Perot bistable device, increasing the gain when operating in the optical transistor mode, and decreasing the DC light bias needed for operation in the optical transistor mode.

A Fabry-Perot cavity such as shown in FIG. 7 may be used as the laser control element shown in FIGS. 1 through 5. Multiple layer heterostructure 110 may have an additional mirror placed on surface 123 in order to place the multiple layer heterostructure 110 inside a Fabry-Perot cavity. Control of the laser may then be accomplished by switching the optical absorption of the multiple layer heterostructure. A grating saturable absorber may be used for the multiple layer heterostructure 110. Also, a grating saturable absorber may be used for the multiple layer heterostructure shown in FIGS. 3 through 5, either with or without mirrors to place the grating saturable absorber inside a separate Fabry-Perot cavity.

An additional advantage in spacing the saturable absorber layers is that the substantial thickness of the spacing layers acts as heat conduction paths while absorption occurs only in the thinner saturable absorber layers. Thermal problems are reduced because: there is more thermal mass; there is more heat-conducting material; and only the temperature of the saturable absorbing layers will significantly alter the refractive index of the device.

MULTIPLE LAYER HETEROSTRUCTURE

A multiple quantum well device is a multiple layer heterostructure which is ideally suited to serve as a laser gain controlling element. A multiple quantum well device is made by sandwiching a semiconductor layer between first and second material layers. The first and second material layers have first and second bandgaps, respectively, and the semiconductor layer has a third bandgap. The thickness of the semiconductor layer is advantageously chosen sufficiently thin that quantum mechanical effects resulting from confinement of charge carriers within the two-dimensional structure of the layer have a measurable effect on the optical properties of the semiconductor layer. A thickness of less than around 500 Angstroms causes such quantum mechanical confinement effects to make a measurable effect on the optical absorption spectra of the semiconductor layer. A structure built up out of many semiconductor layers separated by a material layer having a different bandgap is referred to in the art as a superlattice.

Figure 8:
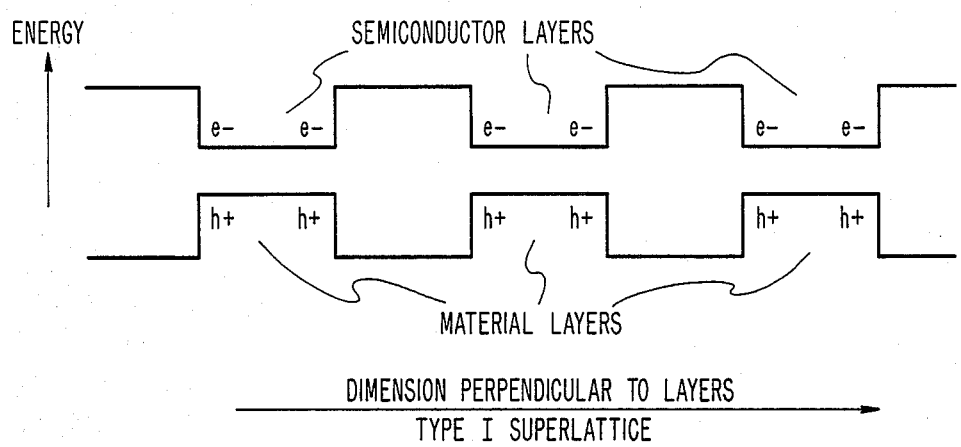
FIG. 8 is a diagram showing the band structure of a Type I superlattice.

Superlattices are divided into at least two categories, a Type I superlattice and a Type II superlattice. In a Type I superlattice, the semiconductor bandgap, the third bandgap referred to in the above discussion, is chosen smaller than the first and second bandgaps of the material layers which lie on either side of the semiconductor layer, and the bottom of the conduction band of the semiconductor layer is below the bottom of the conduction bands of the first and second material layers, and the top of the valence band of the semiconductor layer is above the tops of the valence bands of the first and second material layers. The bandgap structure of a Type I superlattice is shown in FIG. 8.

Figure 9:
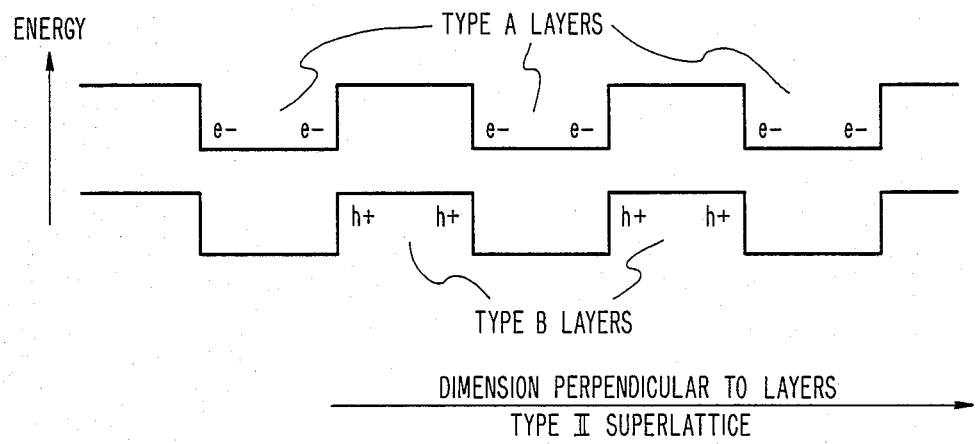
FIG. 9 is a diagram showing the band structure of a Type II superlattice.

In a Type II superlattice, the conduction band and valence band of the semiconductor layer are both below the corresponding conduction band and valence band of the intermediate layer. Charge carriers separate into different layers of a Type II superlattice with electrons being trapped in the layer with lower conduction band and holes being trapped in the layers with higher valence band, as shown in FIG. 9. Electrons and holes recombine by tunneling between layers.

If only one semiconductor layer is desired, then the multiple layer heterostructure will have only three essential layers, the semiconductor layer and the two material layers on either side of the semiconductor layer. The multiple layer heterostructure is then more properly a single quantum well device with the semiconductor layer being the single quantum well. A multiple quantum well is built up out of alternate layers of a semiconductor layer and a material layer. In a simple example, all of the semiconductor layers are made of the same material and have the same thickness and also all of the material layers are made of the same material and have the same thickness. For example, the semiconductor layers may be made of GaAs and the material layers may be made of AlGaAs to form a Type I superlattice. In more complex examples, the thickness of semiconductor layers may vary with layer number, as also may the thickness of the material layers. Also, the bandgap of the various layers may be made to depend upon layer number by varying the alloy composition of the layers. Also, the bandgap within a layer may be graded by a variation of alloy composition within a layer. Molecular beam epitaxy may be conveniently used to grow multiple layer heterostructures with the complex properties described above. Computer-controlled molecular beam epitaxy is a particularly convenient way to make such semiconductor devices.

Both electrons and holes are trapped as charge carriers in the narrow bandgap layers of a Type I superlattice. The charge carriers may be produced in a variety of ways, as for example by absorption of light in either the narrow bandgap layers or the wide bandgap layers. Carriers produced within the wide bandgap layers tend to drift into the narrow bandgap layers where they are trapped. The wide bandgap layers may be made with a graded bandgap, and, when they are, then internal electric fields within the wide bandgap material apply forces on the charge carriers to drive them into the narrow bandgap layers.

Charge carriers which are trapped within the narrow bandgap semiconductor layers of a multiple quantum well undergo a number of interactions. These interactions include: an interaction with the crystal periodic potential which results in the usual band structure of crystalline materials; interactions due to confinement of the electrons and holes within the thin layer of narrow bandgap semiconductor material, and which complicate the band structure of the material; interactions between the electrons and holes which tend to favor exciton formation, as for example, the exciton resonances in the optical spectrum of a GaAs/AlGaAs multiple quantum well structure which are observed at room temperature, and which further complicate the energy levels of the material; shifts in the exciton energy due to the thinness of the narrow bandgap semiconductor layers; and other interactions which affect the optical spectra of charge carriers trapped within a thin layer of narrow bandgap semiconductor.

A distinction between classes of multiple layer heterostructures fabricated as a Type I superlattice is made on the basis of the thickness of the material layers. Charge carriers are trapped within the narrow bandgap semiconductor layers. The alternate wide bandgap material layers are barrier layers to charge mobility. The distinction between classes is based upon whether the charge carrier quantum mechanical wave function penetrates the barrier layer to have an appreciable overlap with the charge carriers in the next narrow bandgap semiconductor layers. If there is appreciable wave function overlap, then the entire layer structure is coupled as a single quantum mechanical system and the term "superlattice" is properly applied to the structure. If the barrier layers are too thick for appreciable wave function overlap, then the individual narrow bandgap semiconductor layers behave independently and are more properly called quantum wells. A device made of a multiple number of alternate narrow bandgap and wide bandgap layers is then more properly termed a multiple quantum well. However, the terminology, Type I superlattice, includes both of the above-discussed classes of devices.

Useful materials for making a multiple layer heterostructure include the following: a GaAs/AlGaAs multiple quantum well; a AlGaAs/AlGaAs multiple quantum well in which different Al content is used for narrow and wide bandgap layers; InGaAs; InGaAlAs; InGaAsP; HgCdTe; GaSb; AlGaSb, and other III-V semiconductor materials and alloys.

It is to be understood that the above-described embodiments are simply illustrative of the principles of the invention. Various other modifications and changes may be made by those skilled in the art which will embody the principles of the invention and fall within the spirit and scope thereof.

What is claimed is:
1. A semiconductor device comprising:
    first layers of material having a nonlinear optical absorption at a predetermined optical frequency; characterized by
    second layers of material alternated with said first layers, and the spacing of said first layers being an integer multiple of one-half the wavelength of light of said predetermined optical frequency.
2. A laser comprising:
    an optical resonator;
    a laser gain medium placed inside said optical resonator, said laser gain medium being capable of emitting light and of lasing with said light; characterized by
    a multiple layer heterostructure, placed inside said optical resonator in such a way that said light passes through at least a portion of the multiple layer heterostructure;
    said multiple layer heterostructure comprising first and second material layers having first and second bandgaps, respectfully, and a semiconductor layer having a third bandgap and being positioned between said material layers in which the thickness of said semiconductor layer is less than 500 Angstroms; and
    means for varying an optical absorption of said multiple layer heterostructure for said light in order to control an optical gain of said optical resonator, and thereby control lasing of said laser gain medium.
3. A controlled laser as in claim 1 wherein said means for varying an optical absorption comprises:
    said laser gain medium emitting said light, at least a part of said light saturating said optical absorption of said multiple layer heterostructure, in order to passively mode lock said laser.
4. A controlled laser as in claim 1 wherein said means for varying an optical absorption comprises:
    a light source external to said optical resonator arranged to illuminate said multiple layer heterostructure.
5. A controlled laser as in claim 1 wherein said means for varying an optical absorption comprises:
    means for applying an electric field to said multiple layer heterostructure.
6. A controlled laser as in claim 1 wherein said multiple layer heterostructure further comprises:
    first and second material layers having first and second bandgaps, respectively, and a semiconductor layer having a third bandgap and being positioned between said material layers.
7. A multiple layer heterostructure as in claim 6 wherein the thickness of said semiconductor layer is sufficient for carrier confinement effects within said semiconductor layer to influence the optical properties of said multiple layer heterostructure.
8. A multiple layer heterostructure as in claim 1 wherein the bottom of the conduction band of said semiconductor layer is below the bottom of the conduction bands of said material layers, and the top of the valence band of said semiconductor layer is above the tops of the valence bands of said material layers.
9. A controlled laser as in claim 1 wherein said multiple layer heterostructure is a Type I superlattice.
10. A controlled laser as in claim 1 wherein said multiple layer heterostructure is a grating saturable absorber.
11. A controlled laser as in claim 1 wherein said multiple layer heterostructure is made using GaAs.
12. A controlled laser as in claim 1 wherein said multiple layer heterostructure is made using AlGaAs.
13. A controlled laser as in claim 1 wherein said multiple layer heterostructure is made using InGaAs.
14. A controlled laser as in claim 1 wherein said multiple layer heterostructure is made using InGaAlAs.
15. A controlled laser as in claim 1 wherein said multiple layer heterostructure is made using InGaAsP.
16. A controlled laser as in claim 1 wherein said multiple layer heterostructure is made using HgCdTe.
17. A controlled laser as in claim 1 wherein said multiple layer heterostructure is made using GaSb.
18. A controlled laser as in claim 1 wherein said multiple layer heterostructure is made using AlGaSb.
19. A laser comprising:
    an optical resonator;
    a laser gain medium placed inside said optical resonator, said laser gain medium being capable of emitting light and of lasing with said light; characterized by
    a multiple layer heterostructure, placed inside said optical resonator in such a way that said light passes through at least a portion of the multiple layer heterostructure;

said multiple layer heterostructure comprising first and second material layers having first and second bandgaps, respectfully, and a semiconductor layer having a third bandgap and being positioned between said material layers in which the thickness of said semiconductor layer is less than 500 Angstroms; and means for varying an index of refraction of said multiple layer heterostructure for said light in order to control an optical gain of said optical resonator, and thereby control lasing of said laser gain medium.

* * * * *